United States Patent [19]
Gilleo et al.

[11] Patent Number: 5,637,176
[45] Date of Patent: Jun. 10, 1997

[54] METHODS FOR PRODUCING ORDERED Z-AXIS ADHESIVE MATERIALS, MATERIALS SO PRODUCED, AND DEVICES, INCORPORATING SUCH MATERIALS

[75] Inventors: Kenneth B. Gilleo, West Kingston, R.I.; Michael C. Corey, Morristown, N.J.

[73] Assignee: Fry's Metals, Inc., Providence, R.I.

[21] Appl. No.: 261,913

[22] Filed: Jun. 16, 1994

[51] Int. Cl.$^6$ .................................................. B32B 31/00
[52] U.S. Cl. ........................ 156/277; 156/285; 156/298; 427/272
[58] Field of Search ........................ 427/282, 272, 427/102; 156/277, 285, 297, 298

[56] References Cited

U.S. PATENT DOCUMENTS

| | | | |
|---|---|---|---|
| 3,320,658 | 5/1967 | Bolda et al. | 29/155.5 |
| 3,541,222 | 11/1970 | Parks et al. | 174/68.5 |
| 3,862,790 | 1/1975 | Davies et al. | |
| 4,113,981 | 9/1978 | Fujita et al. | 174/88 |
| 4,209,481 | 6/1980 | Kashiro et al. | 264/24 |
| 4,449,774 | 5/1984 | Takashi et al. | 339/59 |
| 4,640,981 | 2/1987 | Dery et al. | 174/88 |
| 4,696,764 | 9/1987 | Yamazaki | 252/503 |
| 4,701,279 | 10/1987 | Kawaguchi et al. | 252/511 |
| 4,729,809 | 3/1988 | Dery et al. | 156/306.6 |
| 4,740,657 | 4/1988 | Tsukagoshi et al. | 174/88 |
| 4,811,081 | 3/1989 | Lyden | 357/80 |
| 4,817,277 | 4/1989 | Hieber et al. | 29/832 |
| 4,902,857 | 2/1990 | Cranston et al. | 174/94 |
| 4,931,598 | 6/1990 | Calhoun et al. | 174/117 |
| 4,985,663 | 1/1991 | Nakatani | 315/169.3 |
| 5,001,302 | 3/1991 | Atsumi | 174/94 |
| 5,041,183 | 8/1991 | Nakamura et al. | 156/264 |
| 5,049,085 | 9/1991 | Reylek et al. | 439/91 |
| 5,061,549 | 10/1991 | Shores . | |
| 5,074,947 | 12/1991 | Estes et al. | 156/307.3 |
| 5,123,986 | 6/1992 | Sugiyama et al. | 156/230 |
| 5,129,833 | 7/1992 | Rowlette, Sr. | 439/91 |
| 5,147,210 | 9/1992 | Patterson et al. | 439/91 |
| 5,155,301 | 10/1992 | Mase | 174/88 |
| 5,174,766 | 12/1992 | Yoshizawa et al. | 439/91 |
| 5,183,969 | 2/1993 | Odashima | 174/88 |
| 5,216,807 | 6/1993 | Yoshizawa et al. | 29/876 |
| 5,290,624 | 3/1994 | Bujard . | |

FOREIGN PATENT DOCUMENTS

| | | | |
|---|---|---|---|
| 28 31 984 | 2/1979 | Germany . | |
| 52-28273 | 3/1977 | Japan | 156/285 |
| 60-44787 | 10/1985 | Japan . | |
| 62-7195 | 1/1987 | Japan . | |
| 63-40217 | 2/1988 | Japan . | |
| 63-171913 | 11/1988 | Japan . | |
| 1-10508 | 1/1989 | Japan . | |
| 4-355935 | 12/1992 | Japan | 156/277 |

*Primary Examiner*—David A. Simmons
*Assistant Examiner*—Paul M. Rivard
*Attorney, Agent, or Firm*—Shapiro and Shapiro

[57] ABSTRACT

Ordered Z-axis electroconductive sheet materials are produced by entrapping bodies of fusible, polymeric, electroconductive adhesive at predetermined spaced locations in a sheet-like carrier of fusible, polymeric, dielectric adhesive including a thermoplastic component. The materials are useful for mechanically joining and electrically connecting electronic circuit components.

11 Claims, 5 Drawing Sheets

STEP 1 - STENCIL CONDUCTIVE ADHESIVE PASTE

STEP 2 - HARDEN CONDUCTIVE ADHESIVE

STEP 3 - APPLY DIELECTRIC PASTE

STEP 4 - HARDEN DIELECTRIC PASTE

STEP 5 - REMOVE RELEASE LINER PRIOR TO USE

METHODS FOR PRODUCING ORDERED Z-AXIS ADHESIVE MATERIALS, MATERIALS SO PRODUCED, AND DEVICES, INCORPORATING SUCH MATERIALS

BACKGROUND OF THE INVENTION

This invention relates to anisotropic or so-called Z-axis electroconductive sheet materials (e.g., films) for mechanically joining and electrically connecting electronic circuit components. The invention is more particularly concerned with new methods of producing such materials and with certain materials so produced. The invention is also concerned with electronic assemblies incorporating such materials.

Z-axis adhesive films are well known and have been used commercially in the electronics industry for a number of years. The underlying concept of these films is really quite simple. Basically, a Z-axis film is composed of a sheet-like, dielectric-resin-based adhesive carrier loaded with conductive particles. The particle loading is kept low enough to avoid the formation of continuous electroconductive paths along the adhesive plane (X,Y plane) of the film, whereby the film is rendered conductive, through the particles, only in its thickness direction (Z-direction).

Applications of Z-axis film adhesives are manifold. Typical examples include the bonding of circuits and components such as liquid crystal displays and surface-mount devices. Other exemplary applications include so-called multi-chip modules and chip-on-board systems.

The most common Z-axis adhesive films are randomly conductive by nature, in that the electroconductive particles are randomly distributed throughout the dielectric adhesive carrier. Such randomly conductive films have traditionally been preferred because they are quite easily made. The conductive particles are simply dispersed in a dielectric-resin-adhesive-based solution, and the resulting mixture is then cast to form a film of the desired thickness.

Traditional random Z-axis films typically utilize conductive particles, usually spheres, of non-bonding metals such as silver, nickel, or gold in a thermosetting resin carrier. A common example is silver-filled epoxy film. Recently, more sophisticated non-bonding conductive particles, such as metal-coated non-conductors, are finding increasing use.

When electronic circuit components are joined with such conventional Z-axis films as these above-described, a film of appropriate dimensions is sandwiched between opposed surfaces of the components and the sandwich is subjected to heat and pressure. The dielectric adhesive film is thus caused to conform to the topography of the opposed component surfaces and to bond the surfaces adhesively. Electrical connections are established by pressure contacts of the non-bonding conductive particles and the electrical contact pads on the opposed component surfaces.

Reliability of the electrical connections requires that the conductive particles be maintained under stress. In practice, however, the connections are subject to failure due to such factors as stress relaxation of the dielectric adhesive film and corrosion of metalized surfaces. Also, there is no guarantee that sufficient conductor will be present where needed, because of the random nature of the system. Moreover, conductor will be present between dielectric portions of the opposed component surfaces, leading to undesirable effects including, for example, reduced breakdown voltage, increased dielectric constant, and signal perturbation at high frequencies.

One proposed approach which can avoid the aforementioned problems involves the use of a non-randomly distributed arrangement of conductive regions which also possess adhesive properties. A non-random or ordered distribution is advantageous in that the presence of conductive regions at all locations requiring the formation of an electrical connection can be guaranteed. Conductive regions having adhesive capability are beneficial in that adhesive electrical contacts are formed with the electrical contact surfaces, thereby avoiding the earlier-mentioned disadvantages associated with pressure-contact connections of non-bonding conductive particles.

Notwithstanding their advantages, ordered Z-axis adhesives have been subject to a significant disadvantage in that the methods heretofore proposed for making such materials are relatively complex and inefficient.

SUMMARY OF THE INVENTION

A principal object of the present invention is therefore to provide relatively simple and efficient methods of producing ordered Z-axis adhesive sheet materials having conductive bodies with adhesive properties.

Generally speaking, the invention is based, in one respect, on the use of fusible, polymeric electroconductive adhesives, such as thermoplastic polymers and B-staged thermosetting resins, which are formed as discrete bodies and entrapped in a dielectric adhesive carrier. According to one preferred approach, the bodies may be attached at predetermined locations on the surface of a release material, and the carrier is formed about the discretely arranged bodies. According to another preferred approach, the carrier may be preformed, and the bodies deposited and entrapped in the carrier at predetermined locations.

The invention is based, in another respect, on the use of fusible, polymeric, dielectric adhesives which include a thermoplastic component, for purposes of the carrier. Thermoplastic-polymer-based adhesives, unlike uncured thermosetting materials, have fully developed mechanical properties, including high mechanical strength, flexibility, good dimensional stability, and resistance to squeeze-out under pressure. Therefore, thermoplastic-polymer-based carriers may be readily used without reinforcement. Also unlike thermosetting materials, the thermoplastic-polymer-based adhesives are essentially permanently fusible, so that they can readily be reworked by heating. They also generally require considerably less bonding time, since there is no need to cure.

Thus, according to one of its principal aspects, the present invention provides a method of making a heat-bondable, anisotropically electroconductive adhesive material, comprising the steps of attaching bodies of electroconductive, fusible, polymeric adhesive at predetermined spaced locations on a surface of a release material; and entrapping the bodies on the release material in a sheet-like carrier of fusible, polymeric, dielectric adhesive including a thermoplastic component.

According another of its principal aspects, the invention provides a method of making a heat-bondable, anisotropically electroconductive, adhesive material, comprising the steps of providing a sheet-like carrier of fusible, polymeric, dielectric adhesive including a thermoplastic component; depositing a plurality of bodies of electroconductive, fusible, polymeric adhesive into the carrier at predetermined spaced locations; and entrapping the bodies in the carrier.

The foregoing methods of the invention may advantageously be implemented in such a manner as to provide an adhesive sheet material in which, at one or both sides, the electroconductive adhesive bodies are protuberant in the thickness (Z-axis) direction of the sheet relative to the dielectric adhesive regions of the carrier between the bodies in the adhesive (X,Y) plane. Protuberant bodies promote a higher quality combination of adhesive bonding and electrical connection to the contact surfaces of the opposed electronic components.

Thus, according to yet another of its principal aspects, the invention provides a heat-bondable, anisotropically electroconductive, adhesive material which comprises plural bodies of electroconductive, fusible, polymeric adhesive, entrapped at predetermined spaced locations in a sheet-like carrier of fusible, polymeric, dielectric adhesive including a thermoplastic component, with the electroconductive bodies being protuberant at at least one side surface of the carrier and extending across the thickness of carrier regions separating the bodies.

Additional aspects of the invention relate, for example, to electronic assemblies incorporating adhesive materials produced by the methods discussed above.

BRIEF DESCRIPTION OF THE DRAWINGS

The aforementioned and other aspects of the invention will be more fully appreciated from the detailed description hereinafter, taken in conjunction with the accompanying drawings in which.

DETAILED DESCRIPTION OF THE INVENTION

Figure 1:
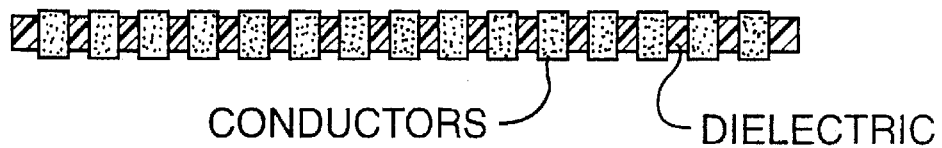
FIGS. 1 and 2 are diagrammatic cross-sectional and perspective views, respectively, of an anisotropic electroconductive material produced in accordance with the present invention.
Figure 2:
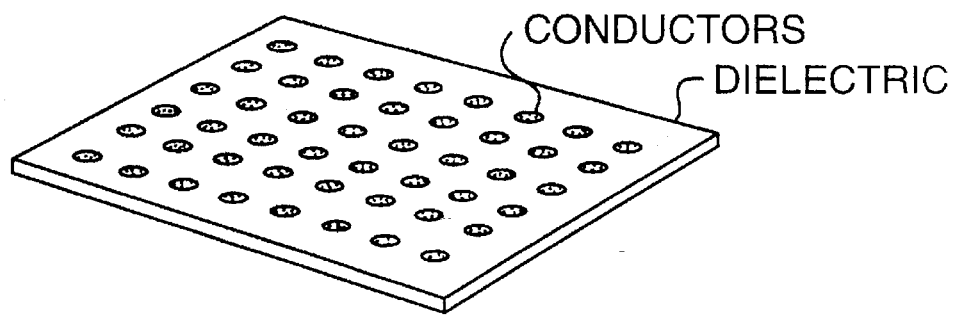

FIGS. 1 and 2 depict an ordered Z-axis, electroconductive, adhesive material in accordance with the present invention. In the form shown, the material includes a regular two-dimensional array of electroconductive adhesive bodies entrapped in a sheet-like carrier of dielectric adhesive, which separates and electrically insulates the electroconductive bodies from one another. A regular array of conductive bodies is not essential to the invention, however, and the bodies may be positioned in any predetermined arrangement as may be suitable for a particular application. The layout of the electroconductive bodies may, of course, be determined to correspond to that of the electronic component connector surfaces to be electrically connected through the material.

As will be seen in FIG. 1, the bodies of electroconductive adhesive are protuberant at the opposite surfaces (upper and lower) of the sheet material, in the thickness direction, with respect to the regions of the carrier between the bodies. Protuberant bodies, as earlier mentioned, facilitate the formation of reliable, electrical and adhesive connections of the bodies to adjacent contact surfaces. In particular, during the bonding process, the protuberant portions of the sheet material will contact the adjacent parts of the electronic component surfaces before the portions of the carrier separating the electroconductive bodies in the adhesive plane. Thus, with the application of heat and pressure, the protuberant portions are enabled substantially freely to deform and spread over the electrical contact surfaces of the components being joined. In practice, the electroconductive bodies may be protuberant at one or both surfaces of the sheet material.

In accordance with the present invention, the electroconductive bodies are constituted by a fusible, polymeric, electroconductive adhesive (isotropic electroconductive adhesive). More particularly, the bodies may be composed of a thermoplastic-polymer-based adhesive, or a partially polymerized thermosetting-resin-based adhesive— preferably B-staged. For most applications, thermoplastic-polymer-based adhesives are preferred because of their mechanical properties, short bonding times, and their inherent reworkability with heating. Many thermoplastic-polymer-based electroconductive adhesives are commercially available, such as the STAYSTIK™ line of electroconductive adhesives sold by Alpha Metals, Inc. of Jersey City, N.J. A preferred electroconductive adhesive from the STAYSTIK™ line is available under the designation STAYSTIK™ 181, a silver-particulate-filled phenoxy resin based adhesive sold as a solvent-containing thixotropic paste suitable for screen printing or syringe dispensing. Other commercially available electroconductive, thermoplastic adhesives include gold- and silver-filled modified polyimides, polyamides (Nylons), unsaturated polyesters (e.g., PET and polybutadiene teraphthalate), polyetherimides (PEI), polyarylates (PAR), polyacrylates (PAC), thermoplastic polyurethanes (also called PUR-polyurethane rubber), polycarbonates, polysulfones (PSO), polyarylsulfones, polyether sulfones (PES), and a variety of other synthetic, natural,.and natural-modified (e.g., cellulose esters) thermoplastic based systems. These materials are generally available in paste and film forms. Other candidates in the STAYSTIK™ product line appear in the material data table found at the end of this specification.

In other applications, partially polymerized thermosetting-resin-based electroconductive (isotropic electroconductive) adhesive bodies may be preferable over thermoplastic-based bodies. Partially polymerized thermosetting resins, preferably B-staged, offer a reasonable degree of mechanical integrity prior to actual use in bonding, and they typically form stronger adhesive bonds than the thermoplastic adhesives. Of course, thermosetting resin materials do not offer the inherent reworkability with heating which characterizes thermoplastics, and they generally require longer bonding times due to the need to cure. Many electroconductive thermosetting-resin-based adhesives are commercially available and suitable for practice of the invention. Typical examples include particulate-metal-filled (e.g., silver-filled) epoxy adhesives. One particularly preferred thermosetting adhesive is Alpha Metals' Poly-Solder, a silver-filled epoxy product of the type described in U.S. Pat. No. 5,180,523 issued Jan. 19, 1993 (incorporated herein by reference).

For purposes of the sheet-like carrier, the present invention utilizes a fusible, polymeric, dielectric (electrically non-conductive) adhesive, including a thermoplastic component. The adhesive may be a thermoplastic polymer resin of the earlier mentioned types, without conductive filler. A dielectric, thermally conductive, particulate filler, such as aluminum nitride, may be included to improve thermal management characteristics. Many such adhesives are commercially available and useful in the practice of the present invention. Examples include Alpha Metals' STAYSTIK™ 383, an unfilled phenoxy resin adhesive, or STAYSTIK™ 282, an aluminum-nitride-filled phenoxy resin adhesive. The materials are generally available in paste and film forms. Additional candidates in the STAYSTIK™ product line appear in the material data table found at the end of this specification.

If increased bonding strength is required of the carrier, a minor amount of a dielectric, thermosetting resin adhesive component may be included in the carrier material. The component may be B-staged by suitable application of heat.

Given the basic principles described herein, the selection of specific electroconductive and dielectric adhesive materials for purposes of practicing the present invention will readily be accomplished by those of ordinary skill in the art.

Turning to the methodology of the invention, two basic approaches will now be described: a conductor-first approach, in which the electroconductive adhesive bodies are initially disposed at predetermined locations and the dielectric adhesive carrier is formed about the bodies, and a dielectric-first approach, in which the sheet-like carrier is pre-provided and the electroconductive adhesive bodies are deposited into the pre-provided carrier. The manner in which the electroconductive adhesive bodies are associated with the carrier will depend upon which of these approaches is adopted.

Figure 3:
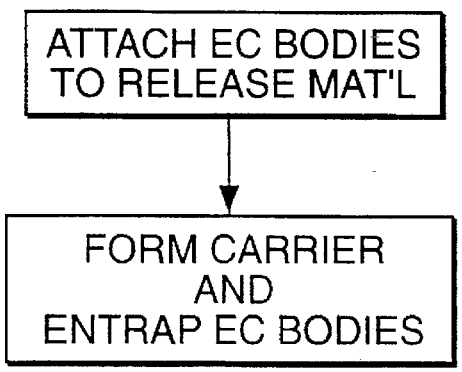
FIG. 3 is a flow diagram showing the general procedure of a first method according to the present invention.

Referring again to the drawings, FIG. 3 shows the basic steps of the conductor-first approach. According to this method, bodies of electroconductive, fusible, polymeric adhesive are initially disposed at predetermined locations on a surface of a release material. Thereafter, the sheet-like carrier of fusible, polymeric, dielectric adhesive including a thermoplastic component is formed about the electroconductive adhesive bodies, and the bodies are entrapped within the carrier. Any suitable release material may be used—for example, D2B/D2B silicon release paper, available from Akrosil Company of Menasha, Wis.

In the conductor first approach, it is usually preferable that the electroconductive bodies be formed on the surface of the release material by application in a non-solid state, preferably as a component of a solvent-containing mixture, such as a paste, and thereafter hardened. As earlier mentioned, electroconductive adhesives used in this invention are generally available in paste form. Such paste materials are preferably applied by screen printing or stencil printing techniques, although other techniques may also be used. Exemplary additional techniques would include pneumatic dispensing and pin-array dispensing.

After deposition on the release material surface, the electroconductive adhesive-containing pastes are readily hardened by volatilizing the solvent from the paste with heating. The use of heating is ordinarily preferred in order to reduce hardening time, although hardening may be achieved without heating, depending on the particular material used, and if minimizing processing time is not an important consideration. When heating is used to harden the electroconductive adhesive, the temperature-time profile should be so determined that the solvent is volatilized at a rate which is not so fast as to promote the formation of voids in the hardened bodies. A suitable temperature-time profile will, of course, depend upon the particular paste or mixture used and the dimensions of the deposits on the release material.

It is also possible to attach the thermoplastic electroconductive bodies by applying the adhesive in a heat-softened or molten hot state to the release material surface. Hardening would be achieved by allowing the deposits to cool.

In the case of a thermosetting adhesive, the temperature-time profile is suitably determined to volatilize the solvent and to effect partial polymerization of the thermosetting resin, preferably to a B-stage, whereby the resulting bodies will exhibit reasonable mechanical integrity and still remain fusible.

After the electroconductive bodies are deposited and hardened on the release material, the next step of the conductor-first process is to form the carrier about the bodies and entrap the bodies in the carrier. The carrier is formed by depositing a suitable thermoplastic-polymer-containing dielectric adhesive at least in the spaces between the electroconductive adhesive bodies on the release material, in order to form a substantially continuous composite sheet together with the bodies. This may be accomplished by various techniques, including reverse screening, reverse stenciling, or any other technique suitable for selectively depositing the dielectric adhesive in the inter-body spaces. More preferred, however, is a non-selective coating technique in which the dielectric adhesive paste or the like is actually coated over the electroconductive bodies. This technique will be described in connection with FIGS. 4A–4E.

Figure 4A:
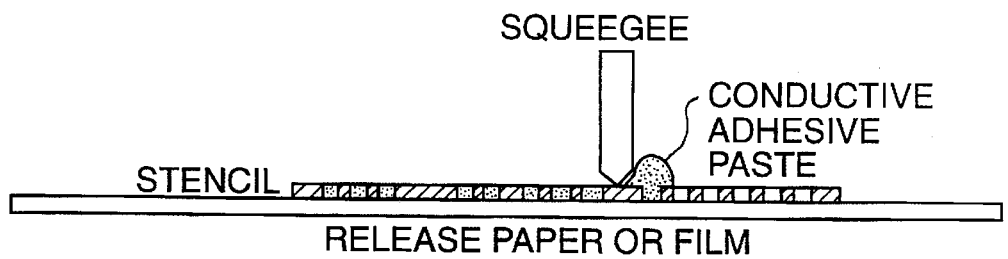
FIGS. 4A–4E diagrammatically illustrate the steps of a preferred embodiment of the first method.
Figure 4B:
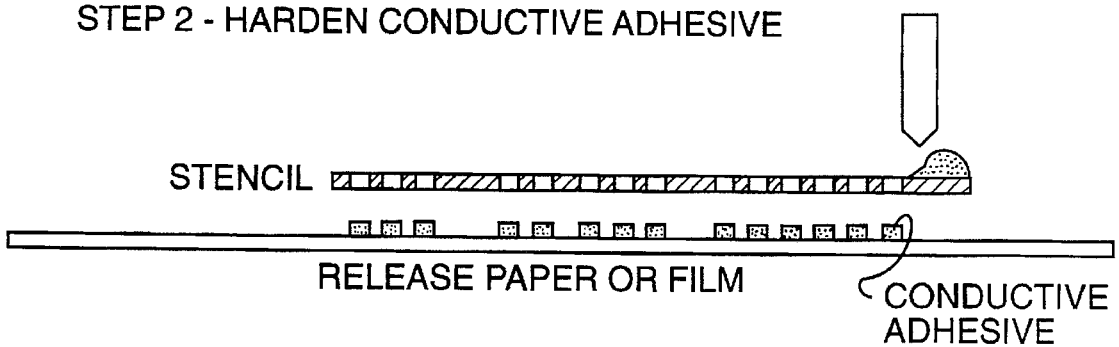

FIGS. 4A–4E illustrate a preferred embodiment of the invention according to the dielectric-first approach. In this embodiment, the electroconductive bodies are formed by depositing a paste containing an electroconductive, fusible, polymeric adhesive onto the surface of a release material with a squeegee doctor-blade through a stencil (FIG. 4A). The stencil is thereafter removed so as not to disturb the paste deposits, and the electroconductive adhesive is then hardened by volatilizing the solvent from the paste, preferably with heating (FIG. 4B). The upper surfaces of the bodies may assume a slightly convex, domed shape as a result of the effects of surface tension.

Figure 4C:
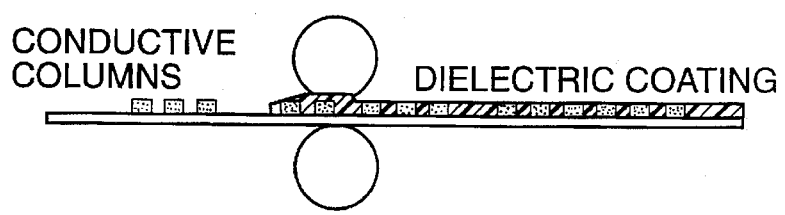

After the electroconductive bodies have cooled, a dielectric, thermoplastic-polymer-containing adhesive is doctor-blade coated over the hardened conductive bodies and into the inter-body spaces (FIG. 4C). In the form shown, the dielectric adhesive is bar-coated, with a gap set so as to miss contacting with the tops of the electroconductive bodies by a small distance.

Figure 4D:
Figure 4E:

After completion of the coating process, the dielectric adhesive is hardened by volatilizing the solvent from the paste—again, preferably with heating (FIG. 4D). During the hardening process, the carrier material and the electroconductive bodies become bonded. At this point (after cooling if heating is used to harden the carrier), the adhesive sheet material can be separated from the release material, as by peeling, and is then ready for use (FIG. 4E)

When forming the dielectric carrier in accordance with the method just described, it is particularly advantageous to set a balance between the applied coating thickness and the volume reduction of the coating (due to escape of the solvent) upon hardening, whereby the coating recedes downwardly from the tops of the electroconductive bodies. The bodies will thereby become protuberant in the thickness direction of the carrier relative to the upper carrier surface in the regions separating the bodies. The advantages of such protuberant bodies have previously been discussed.

It will be appreciated that the above-described embodiment may result in a thin residual coating of carrier adhesive remaining on at least parts of the upper surfaces of the electroconductive bodies of the finished material. However, this does not prevent the achievement of good electrical connections under the normal application of heat and pressure during the bonding of electronic components.

While such residual coatings of carrier material on the upper surfaces of the electroconductive bodies are generally well tolerated, it is possible, in accordance with a further feature of the invention, to minimize the formation of such residues. More particularly, this may be accomplished by the addition of a small amount of surfactant to the adhesive mixture (such as paste) used to form the electroconductive bodies. An addition of from about 0.5% to about 2.0% by weight (based on resin content) of fluorosurfactant to the adhesive mixture will ordinarily suffice. Fluorosurfactants generally provide a stronger surfactant effect than other classes of surfactants, and therefore are more effective in smaller amounts. When incorporated into the conductive adhesive mix, a surfactant lowers the surface energy of the deposits and makes them poorly wettable by the dielectric adhesive coating. This hinders the formation of a residual coating of dielectric adhesive on the upper electroconductive body surfaces as the dielectric adhesive recedes from the upper portions of the conductors during hardening. The effect may be enhanced when the upper surfaces of the bodies are dome shaped or the like (e.g., sloping). An exemplary fluorosurfactant which may be used for the foregoing purpose is FC-430 Fluorosurfactant, available from 3M Company. An addition of this surfactant in the aforementioned range will result in a residual content of about 0.15% to about 0.6% fluorosurfactant (by weight) in the electro-conductive bodies after hardening.

Figure 5:
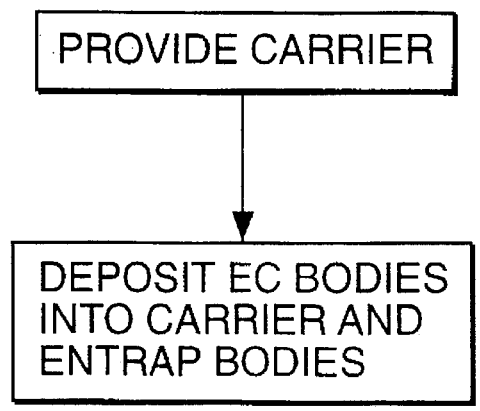
FIG. 5 is a flow diagram showing the general procedure of a second method according to the invention.

The dielectric-first approach will now be described. FIG. 5 shows the basic steps of this procedure. As indicated, the dielectric-first approach starts with the provision of the carrier. The carrier will be a sheet-like form of fusible, polymeric, dielectric adhesive including a thermoplastic component. The same carrier materials as were discussed in connection with the conductor-first approach may be used, although in sheet form. For example, a sheet-form counterpart of the earlier mentioned STAYSTIK™ 383 is available under the designation STAYSTIK™ 482. See the earlier-mentioned data table for additional candidates.

The next step in the dielectric-first approach is to deposit and entrap the electroconductive bodies in the carrier. The same types of electroconductive materials as were described in connection with the conductor-first approach may be used.

While not necessary in all cases, it is generally preferable that the carrier sheet material be formed with holes. Such holes may be formed by any suitable method, such as by punch, drill, or laser. The electroconductive adhesive may then readily be deposited into the holes in a hardened state, or in a non-solid state, such as a paste.

When the electroconductive adhesive bodies are deposited in a hardened state, it is preferable to use adhesive particles of substantially spherical shape. Such particles may be formed as described in our concurrently filed United States patent application entitled, "Electroconductive Adhesive Particles for Z-Axis Application, Uses Thereof, and Methods of Making the Same," incorporated herein by reference. Entrapment of the particles may be effected by the application of heat to soften the bodies and/or the carrier such that two become adhesively bonded.

Figure 6:
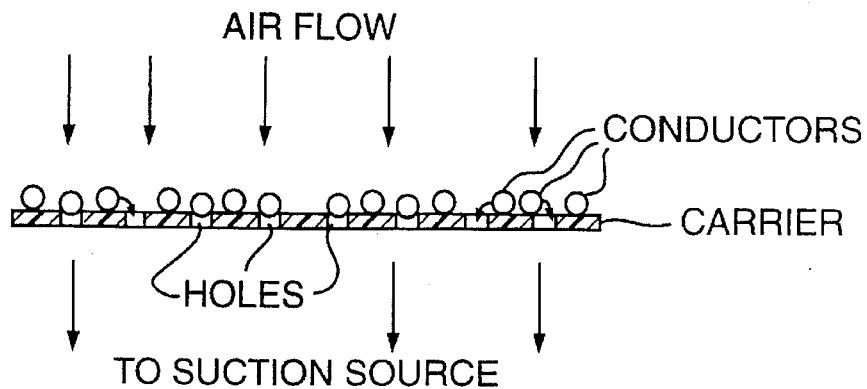
FIGS. 6, 7A, and 7B diagrammatically illustrate steps of preferred embodiments of the second method.

FIG. 6 diagrammatically illustrates a preferred technique for depositing hardened electroconductive adhesive spheres into a carrier pre-formed with holes. As shown in FIG. 6, the dielectric carrier is placed over a suction source, and conductive adhesive spheres are passed over the surface. The spheres are drawn into the holes by the suction air flow through the holes. Filling of the holes may be detected by vacuum measurement techniques. When all the holes are filled, the spheres are simultaneously locked in the carrier, such as by pushing them into the carrier with a heated, non-stick (e.g., TEFLON™) platen. The spheres may then be protuberant at both sides of the carrier. As another approach to filling the holes, the carrier sheet could be placed in a fluidized bed of the conductive spheres.

When deposited in a non-solid state, such as a paste, the electroconductive adhesive may be filled into the holes of the carrier material and the solvent thereafter volatilized to harden the electroconductive adhesive. Entrapment can be effected with heating. Electroconductive adhesive pastes and the like may be deposited into the holes either directly, as discrete deposits, or by coating an entire surface of the carrier, as by doctor blading, so as to fill the holes. In the latter case, the carrier surface should be pre-provided with a removable mask layer, with holes corresponding to those of the carrier. Such a mask layer may, for example, be constituted by a soluble coating formed on the surface of the carrier material, such as an alcohol- or water-soluble resin (e.g., polypyrrolidones, polyvinyl alcohols, solubilized celluloses, and hydroxy-alkyl cellulose products), or by a peelable release film. Product 336T in the earlier-mentioned data table is a suitable soluble mask material. Preferably, the mask layer is present on the surface of the carrier material during formation of the holes. After hardening of the electroconductive adhesive, the mask layer is removed by peeling or dissolving, as appropriate, whereby the surface of the carrier in the regions between the electroconductive bodies is rendered substantially free of electroconductive adhesive. The carrier, incidentally, may also be disposed on a release material for purposes of the dielectric-first approach.

Figure 7A:
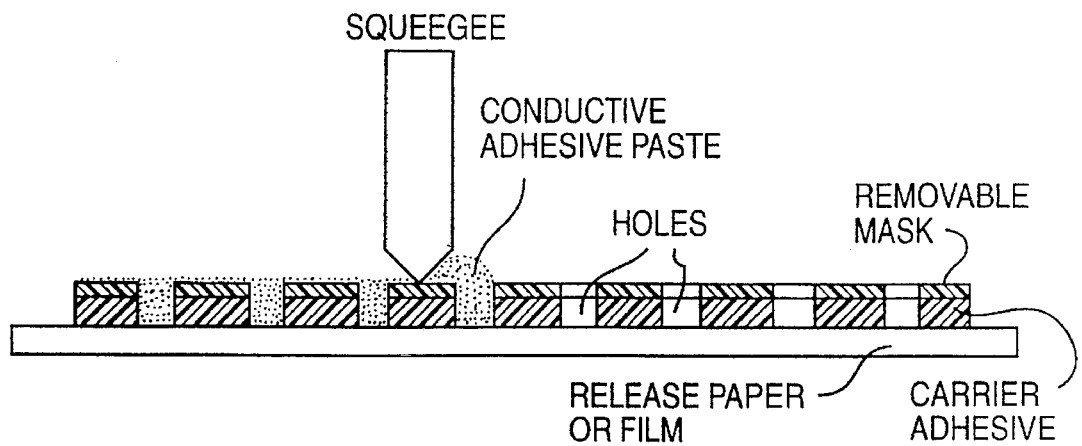
Figure 7B:
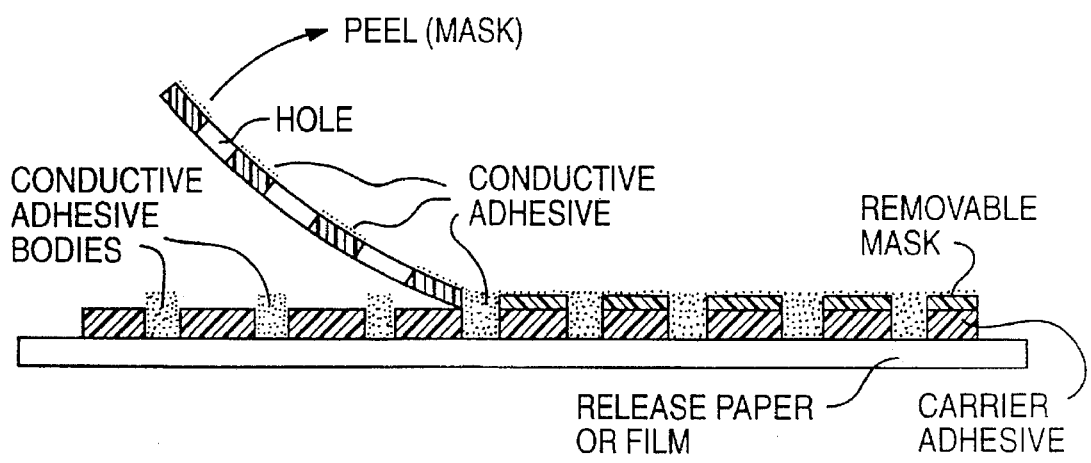

FIGS. 7A and 7B illustrate a process using a mask layer as just described.

As alluded to earlier, holeless carriers may also be used in the dielectric-first approach. In such case, the electroconductive adhesive is preferably deposited into the carrier in a heated state. Heated electroconductive thermoplastic adhesive droplets or the like, may be dropped onto the carrier and self-embed therein.

The following is a list of preferred parameters for anisotropically electroconductive adhesive materials produced in accordance with the present invention.

Carrier Thickness: From about 25 to about 250 microns at inter-body regions.

Conductive Bodies (Printed): From about 25 to about 300 microns in carrier thickness direction; cross-dimension from about 5 to about 25 microns.

Conductive Bodies (Spheres): From about 25 to about 300 microns in diameter.

Conductive Body Protuberance: Up to about 50 microns.

EXAMPLE

An anisotropically electroconductive sheet material was produced in accordance with the invention as follows. An 8 in.×8 in. piece of the earlier-mentioned silicon release paper, D2B/D2B, was secured to by taping to a clean table top. A metal stencil 0.75 mm thick and having a 1 in.×3 in. grid of 1.0 mm diameter holes on 1.5 mm centers was placed on the top surface of the release paper. Approximately 3 grams of the earlier-mentioned STAYSTIK™ 181 conductive adhesive paste was placed along an edge of the stencil adjacent to the holes. Using a 90 durometer squeegee, the conductive adhesive paste was doctor bladed across the stencil and deposited onto the release paper surface through the holes.

The stencil was then gently lifted from the release paper, so as not to disrupt the paste deposited on the release paper through the holes. The release paper, with the adhesive deposits thereon, was then placed in an air oven at 150° C. for fifteen minutes and thereafter removed from the oven and allowed to cool to room temperature. Next, the release paper was again secured by taping to a clean surface at either side of the hardened electroconductive bodies. A quantity of the earlier-mentioned STAYSTIK™ 383 dielectric adhesive paste was then deposited along an edge of the release paper near the conductive bodies. The dielectric adhesive paste Adhesive bonding of the component to the circuit is effected not only by the carrier regions disposed between the electroconductive bodies, but also by the electroconductive bodies themselves to the opposed contact pads (FIG. 8B).

It will be appreciated by those of ordinary skill in the art that many variations are possible in keeping with the basic principles of the invention as herein described. The scope of the invention is, of course, defined by the appended claims.

ALPHAMETALS THERMOPLASTIC ADHESIVES

| THERMO-PLASTIC ADHESIVE P/N'S | | | PROCESS AND USE TEMPERATURES (In Degrees Centigrade) | | | | MECHANICAL/ELECTRICAL TYPICAL CHARACTERISTICS | | | |
|---|---|---|---|---|---|---|---|---|---|---|
| Paste | Film | Filler | Tg | Bonding Range | Onset of Decomposition | Rework (Min.) | Die Shear (PSI @ 25 C.) | Thermal (W/M-C) | Vol-Resist (Ohm-cm) | Modulus of Elasticity |
| 101 | 501 | Ag | 180 | 275–375 | 390–420 | 350 | 4000 | 3.0 | $1 \times 10^{-4}$ | 360,000 psi |
| 151 | — | Au | | | | | | 2.0 | $2 \times 10^{-4}$ | |
| 211 | 611 | Al N | | | | | | 1.0 | $1 \times 10^{+12}$ | |
| 301 | 415 | None | | | | | | 0.3 | $1 \times 10^{+12}$ | |
| 171 | 571 | Ag | 25 | 150–200 | 250–270 | 160 | 2200 | 3.0 | $1 \times 10^{-4}$ | 60,000 psi |
| 272 | 672 | AlN | | | | | | 1.0 | $1 \times 10^{+12}$ | |
| 371 | 472 | None | | | | | | 0.3 | $1 \times 10^{+12}$ | |
| 181 | 581 | Ag | 85 | 160–250 | 320–350 | 170 | 3000 | 3.0 | $1 \times 10^{-4}$ | 400,000 psi |
| 282 | 682 | AlN | | | | | | 1.0 | $1 \times 10^{+12}$ | |
| 383 | 482 | None | | | | | | 0.3 | $1 \times 10^{+12}$ | |
| 191 | 591 | Ag | 45 | 160–220 | 250–270 | 170 | 2600 | 3.0 | $1 \times 10^{-4}$ | 500,000 psi |
| 292 | 692 | Al N | | | | | | 1.0 | $1 \times 10^{+12}$ | |
| 393 | — | None | | | | | | 0.3 | $1 \times 10^{+12}$ | |
| — | 401 | N | 145 | 250–300 | 350–400 | 250 | 3600 | 0.2 | $1 \times 10^{+12}$ | 360,000 psi |
| — | 421 | O | 120 | 200–230 | 280–300 | 210 | 3800 | 0.22 | | 150,000 psi |
| — | 451 | N | 280 | 330–400 | 480–520 | 350 | 4900 | 0.25 | | 370,000 psi |
| — | 473 | E | −40 | 100–150 | 200–220 | 110 | 1700 | 0.21 | | 60,000 psi |
| 373 | — | | 90 | 160–220 | 300–320 | 170 | 2900 | 0.3 | | 350,000 psi |
| 336T | — | None | | 100–125 | 150–160 | 100 | Temporary Attach Mtl: Alcohol Soluble | | | |

NOTES:
1. THE 101/501 AND 181/581 FAMILIES MEET/EXCEED MIL-STD-883D METHOD 5011.2
2. THE 191/591 FAMILY IS SOLUBLE IN ALCOHOL AND CAN BE USED AS A TEMPORARY BONDING MATERIAL SIMILAR TO THE 336T MATERIAL.
3. THE 421 MATERIAL IS 100× LESS PERMEABLE THAN TYPICAL EPOXIES AND CAN PASS $1 \times 10^{-8}$ (He) LEAK RATE TESTS FOR LID SEALS.

was then doctor-blade coated across the conductive bodies with a 90 durometer squeegee so as to fill the inter-body spaces, with the blade gap being set so to barely avoid contact with the upper surfaces of the conductive bodies. The casting paper with the deposited bodies and dielectric adhesive coating was then returned to the oven at 150° C. for fifteen minutes and thereafter removed from the oven and allowed to cool to room temperature. An anisotropically electroconductive adhesive film containing bodies of electroconductive thermoplastic adhesive entrapped within a sheet-like carrier of dielectric thermoplastic adhesive was thereby obtained. The body protuberance from the upper surface of the inter-body regions of the carrier was about 0.005 in.

Figure 8A:
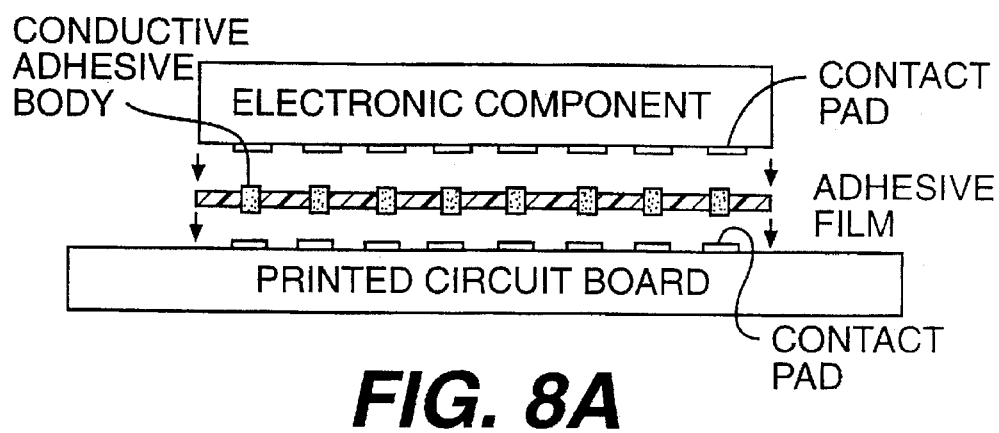
FIGS. 8A and 8B illustrate the process of bonding electrical components with an adhesive material produced in accordance with the present invention.
Figure 8B:
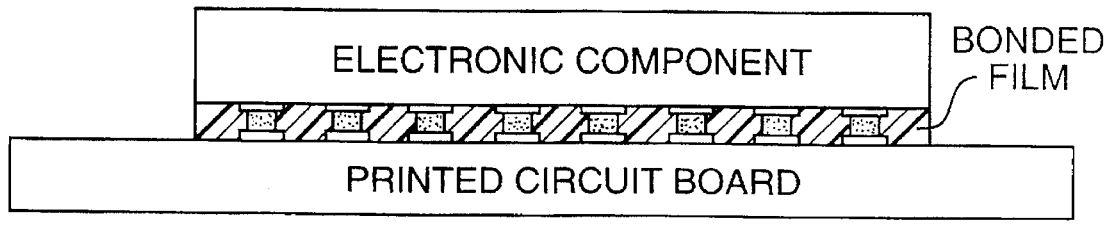

FIGS. 8A and 8B depict the use of a material in accordance with the invention for purposes of bonding an electronic component, such as a ball grid array without the usual solder balls, having an array of electrical contact pads to corresponding contact pads of a printed circuit board. The material of the invention is sandwiched between the component and the circuit board with the electroconductive adhesive bodies aligned with the respective contact pads (FIG. 8A). Heat and pressure are then applied to the sandwich, whereby the opposed surfaces of the component and the circuit board are adhesively bonded and electrically connected through the interposed anisotropic adhesive.

What is claimed is:

1. A method of making a heat-bondable, anisotropically electroconductive, adhesive material, comprising the steps of:
   providing a carrier sheet of fusible, polymeric, dielectric adhesive including a thermoplastic component;
   forming holes at predetermined spaced locations in the carrier sheet;
   depositing a plurality of substantially spherical preformed bodies of electroconductive, fusible, polymeric adhesive in a substantially solid state on one side of the carrier sheet;
   drawing the bodies into the holes under suction applied from an opposite side of the carrier sheet; and
   entrapping the bodies in the holes.

2. A method according to claim 1, wherein the electroconductive adhesive includes a component selected from the group consisting of thermoplastic polymers and partially polymerized thermosetting resins.

3. A method according to claim 2, wherein the electroconductive adhesive includes an electrically conductive, particulate filler.

4. A method according to claim 1, wherein the dielectric adhesive includes a thermosetting resin component.

5. A method according to claim 1, wherein the dielectric adhesive includes a thermally conductive, dielectric, particulate filler.

6. A method according to claim 1, 2 or 4, wherein the bodies are entrapped in the holes by heating the bodies simultaneously with each other.

7. A method according to claim 1, wherein the carrier sheet has a thickness of from about 25 microns to about 250 microns in regions separating the bodies.

8. A method according to claim 7, wherein the bodies have a diameter greater than said thickness of the carrier sheet.

9. A method according to claim 1, 2, or 4, wherein the bodies are entrapped in the holes by heating.

10. A method according to claim 1, 2, or 4, wherein the bodies are entrapped in the holes simultaneously with each other by pushing the bodies into the holes with a heated platen.

11. A method according to claim 10, wherein the bodies are pushed into the holes such that they are proturberant from the opposite sides of the carrier sheet.

* * * * *